(12) United States Patent
Tseng et al.

(10) Patent No.: US 8,097,953 B2
(45) Date of Patent: Jan. 17, 2012

(54) THREE-DIMENSIONAL INTEGRATED CIRCUIT STACKING-JOINT INTERFACE STRUCTURE

(75) Inventors: Ming-Hong Tseng, Toufen Township (TW); Kai-Ming Ching, Jhudong Township (TW); Chen-Shien Chen, Zhubei (TW); Ching-Wen Hsiao, Banqiao (TW); Hon-Lin Huang, Hsin-Chu (TW); Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 12/259,879

(22) Filed: Oct. 28, 2008

(65) Prior Publication Data
US 2010/0102453 A1 Apr. 29, 2010

(51) Int. Cl.
*H01L 23/52* (2006.01)

(52) U.S. Cl. .............................. 257/774; 257/E23.011

(58) Field of Classification Search .................. 257/774, 257/E23.011
See application file for complete search history.

(56) References Cited

U.S. PATENT DOCUMENTS

| 7,049,170 | B2 | 5/2006 | Savastiouk et al. | |
|---|---|---|---|---|
| 7,241,675 | B2 | 7/2007 | Savastiouk et al. | |
| 2005/0136634 | A1* | 6/2005 | Savastiouk et al. | 438/597 |
| 2009/0278238 | A1* | 11/2009 | Bonifield et al. | 257/621 |

* cited by examiner

*Primary Examiner* — Kiesha Bryant
*Assistant Examiner* — Marvin Payen
(74) *Attorney, Agent, or Firm* — Slater & Matsil, LLP

(57) ABSTRACT

A system, a structure and a method of manufacturing stacked semiconductor substrates is presented. A first substrate includes a first side and a second side. A through substrate via (TSV) protrudes from the first side of the first substrate. A first protruding portion of the TSV has a conductive protective coating and a second protruding portion of the TSV has an isolation liner. The system further includes a second substrate and a joint interface structure that bonds the second substrate to the first substrate at the conductive protective coating of the first protruding portion of the TSV.

20 Claims, 8 Drawing Sheets

THREE-DIMENSIONAL INTEGRATED CIRCUIT STACKING-JOINT INTERFACE STRUCTURE

TECHNICAL FIELD

The present invention relates generally to substrate-to-substrate bonding for three-dimensional interconnect substrates and in particular to a three-dimensional (3D) substrate stacking-joint interface structure employing a pretreated through substrate via (TSV) protrusion and bonding.

BACKGROUND

Semiconductor devices are manufactured by forming active regions in a semiconductor substrate, depositing various insulating, conductive, and semiconductive layers over the substrate, and patterning them in sequential steps. The upper or last-formed layers of the semiconductor device typically comprise metallization layers. The metallization layers typically comprise one or more layers of metal interconnect having conductive lines disposed within an insulating material and may provide connections to underlying active regions and connections within and over the substrate. Integrated circuit chips may be attached to a lead frame and then packaged in a ceramic or plastic carrier.

As the cost of shrinking semiconductor devices continues to increase, however, alternative approaches, such as extending the integration of circuits into the third dimension or semiconductor substrate stacking are being explored. Two or more substrates are bonded together to form a three-dimensional structure.

In a known manufacturing process, a contact pad metal layer is deposited and patterned over the substrate. A passivation dielectric layer is formed on the contact pad metal layer. Openings are formed in the dielectric layer to expose the contact pads. As a result, the contact pads are recessed into the chip's surface. To connect the contact pads to the printed circuit board (PCB), protruding metal bumps are formed on the contact pads. Bumps are bonded to PCB contact pads with solder, an adhesive, or by thermal or thermosonic compression.

Bumps may be made of solder. The die is placed on the PCB with bumps on metal pads and solder is reflowed to form solder joints. Thus, the attachment may be mechanically strong and reliable in the presence of thermal stresses, but the solder bumps are difficult to scale down as contact pads become smaller and the pitch between the pads is reduced. As the solder bump sizes decrease to accommodate the smaller contact pads and pitches, the solder joints become mechanically and thermally weaker. In addition, the solder ball (solder bump) size defines the standoff distance between the chips. If the standoff is too small, there will be increased fatigue stresses on the solder joints during thermal cycling.

Moreover, in solder bump interconnects, solder wetting onto bond pads is a key factor that determines the interconnect process yield and the solder joint reliability. Solder wetting involves various physical attributes such as surface tension imbalance, viscous dissipation, molecular kinetic motion, chemical reaction, and diffusion. The degree of wetting may be described by the contact angle, the angle at which the liquid interface meets the solid interface. The degree of wetting between the copper and conventional eutectic solder may not be optimum. If the wetting is poor, the solder may form a compact droplet on the copper surface, leaving insufficient area bonded between the copper and the eutectic solder.

Further, solder joint reliability may be a problem in that copper easily oxidizes and may oxidize during the solder process. If the copper oxidizes, a good electrical contact may not be provided. Moreover, the relatively large size of the solder bumps, which may be in the range of tens of microns and greater, is not conducive to shrinking devices.

SUMMARY OF THE INVENTION

These and other problems are generally solved or circumvented, and technical advantages are generally achieved by forming a system, a structure and a method of manufacturing a 3D substrate stacking-joint interface structure by bonding a pretreated through substrate via (TSV) protrusion to another substrate.

In accordance with an illustrative embodiment, a system, a structure and a method of manufacturing a stacking-joint interface structure is presented. The system provides a first substrate including a first side and a second side. A through substrate via (TSV) protrudes from the first side of the first substrate. A first protruding portion of the TSV has a conductive protective coating and a second protruding portion of the TSV has an isolation liner. The system further includes a second substrate and a stacking-joint interface structure that bonds the second substrate to the first substrate at the conductive protective coating of the first protruding portion of the TSV.

One advantage for an illustrative embodiment is that the package size of the total device may be scaled down because of the fine pitch assembly of the 3D substrate stacking-joint interface by TSV and copper protrusion.

Another advantage is that the isolation spacer around the copper protrusion reduces or eliminates current leakage. An additional advantage is that a 3D substrate stacking-joint interface structure eliminates first side isolation and metallization. This reduces overall cost of the process. A further advantage is that the process of combining TSV and solder plating eliminates the need for the top side µ-bump photo process, further reducing costs.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

Figure 1:
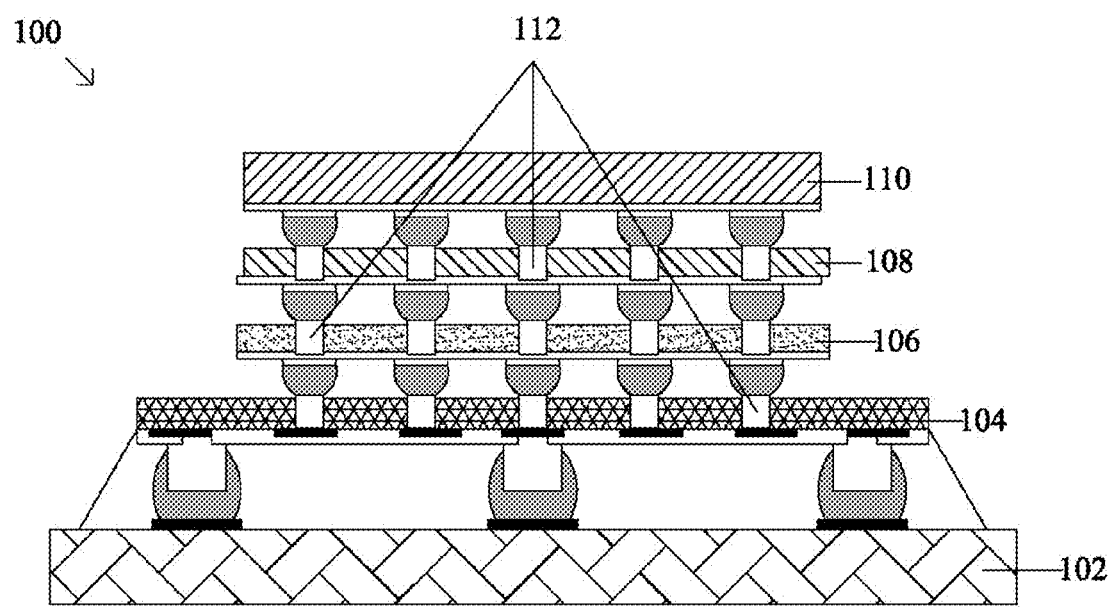
FIG. 1 shows a system of 3D substrate stacking-joint interface structures, according to an illustrative embodiment.

Turning to FIG. 1 a stacking-joint interface system 100, according to an illustrative embodiment, is shown. System 100 includes a first substrate 102, a second substrate 104, a third substrate 106, a fourth substrate 108, and a fifth substrate 110. The substrates 104, 106, 108, and 110 may comprise silicon or other semiconductor materials, for example. Further, substrates, such as substrate 102, may be comprised of non-semiconductor materials, such as bismaleimide triazine (BT), or the like.

Substrates 104-110 may include one or more conductive layers. There may be multiple metallization layers formed within substrates 104-110, for example, and substrates 104-110 may include a plurality of other layers such as inter-poly oxide (IPO) or inter-metal dielectric (IMD) layers (not shown). Substrates 104-110 may also include other active components or circuits. Further, system 100 may include additional substrates therein (also not shown). Hereafter, the term "substrate" generally refers to a semiconductor substrate including a semiconductor substrate on which various layers and structures are formed.

Note that although the term layer is used throughout the specification and in the claims, the resulting features formed using the layer should not be interpreted together as only a continuous or uninterrupted feature. As will be clear from reading the specification, the layer may be separated into distinct and isolated features (e.g., active regions), some or all of which comprise portions of the semiconductor layer. In other embodiments, a layer may refer to a continuous feature having a uniform appearance yet it may include regions having different physical or chemical properties.

Moreover, any or all of substrates 104-110 may comprise through substrate vias (TSVs) 112. TSVs 112 protrude from a first side of a substrate. TSVs provide an electrical connection between the first side and a second side of a substrate.

Figure 2A:
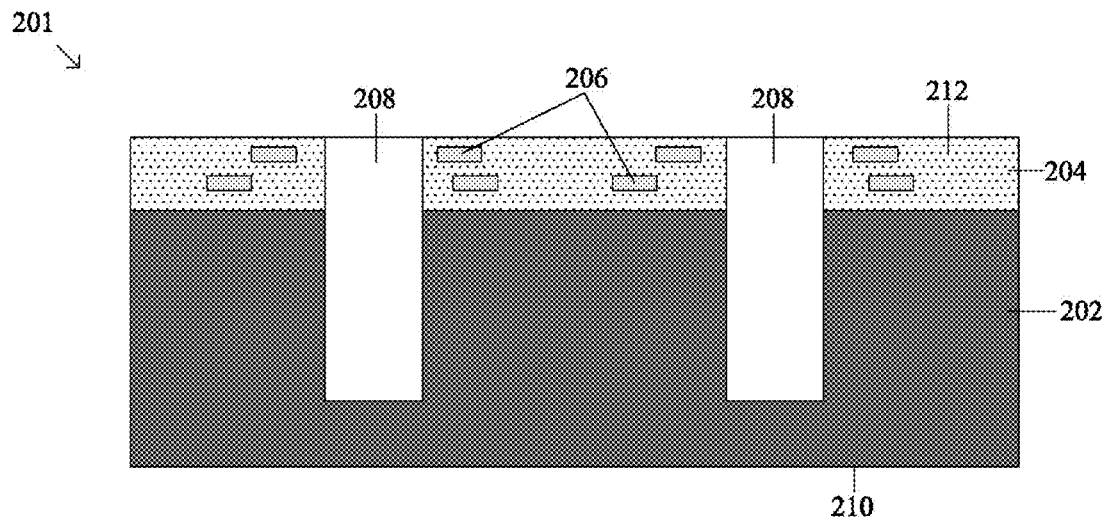
FIGS. 2A-2K are cross-sectional views of a method of manufacturing a stacking-joint interface structure, in accordance with an illustrative embodiment.

FIGS. 2A-2K show selected cross-sectional views of a method to manufacture a stacking joint interface structure. Turning to FIG. 2A, substrate 201 is shown in process. Substrate 201 includes bulk 202 and interconnect layer 204. Substrate 201 includes active components or circuits formed in the front end of line (FEOL), such as components 206. Bulk 202 may comprise silicon, other semiconductor material, or silicon oxide over single-crystal silicon, for example. Compound semiconductors, GaAs, InP, Si/Ge, or SiC, as examples, may be used in place of silicon. Substrate 201 may include other conductive layers or other semiconductor elements, e.g. transistors, diodes, etc.

First side 210 of substrate 201 is oriented down. Second side 212 of substrate 201 is shown oriented up, as may be typical during circuit processing. TSV openings 208, within which TSV structures are formed, are oriented down into substrate 201. Other layers, such as interconnect layer 204, components 206, and devices are indicted within substrate 201.

To form TSV openings 208, substrate 201 may be patterned, for example, by depositing a photoresist (not shown) over second side 212 of substrate 201. Using a reticle having transparent regions and opaque regions, photoresist or a hard mask (not shown) may be patterned using techniques well known in the art.

TSV openings 208 may be etched using a reactive-ion plasma process, for example. A Bosch process, which is capable of achieving a high aspect ratio structure, may be implemented in an embodiment. In an alternate embodiment a wet etch may be implemented. The resultant cross-section is shown in FIG. 2A. TSV openings 208 may be about 85 µm to about 95 µm deep, and about 20 µm to about 30 µm in diameter in one embodiment. However, TSV openings 208 of other depths and diameters are within the scope of these embodiments.

Figure 2B:
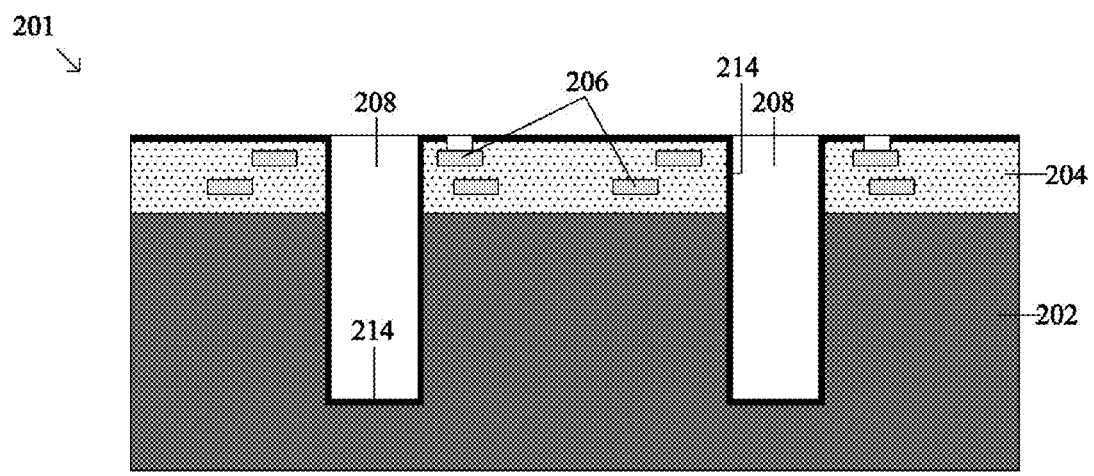

TSV openings 208, thus etched, are coated with a dielectric layer or layers, such as TEOS, $SiO_2$, SiN, a low-k dielectric, combinations, or other dielectrics to form isolation liner 214, as shown in FIG. 2B. Isolation liner 214 may be deposited in a chemical vapor deposition (CVD) process, for example. Isolation liner 214 may be, for example, about 5 k Å to about 15 k Å of $Si_3N_4$, followed by about 20 Å to about 30 Å of $SiO_2$. Isolation liner 214 may act as a passivation layer between bulk 202 and the subsequent metal conductor filled into TSV openings 208.

Figure 2C:
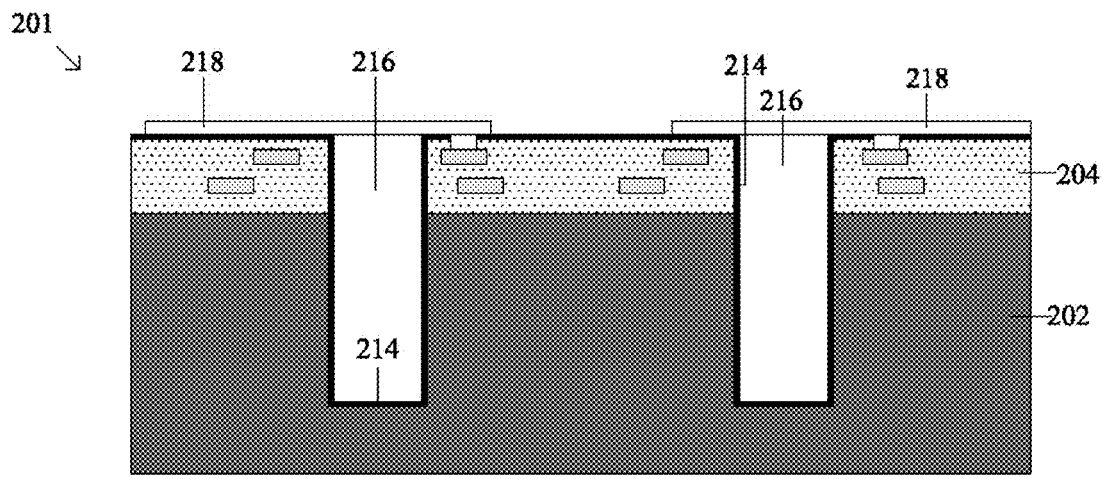

Turning to FIG. 2C, TSV openings 208, as found in FIG. 2B, are filled with conductive material, forming TSV structures 216. Metal, such as Al, Cu, alloys and the like may be sputtered, electro-plated, or screen-printed to fill TSV structures 216. Preferably, the process includes sputtering a seed layer of a metal, such as Cu, for example, into TSV openings 208. TSV openings 208 are then electro-plated with Cu, for example. Alternatively, other conductive materials may be used. Following the disposition of conducting material, substrate 201 may be planarized by a CMP process. Moreover, a conducting pad 218 may be formed following the CMP process. Conducting pad 218 may be formed by known processes, such as a disposition, pattern and etch process.

Figure 2D:
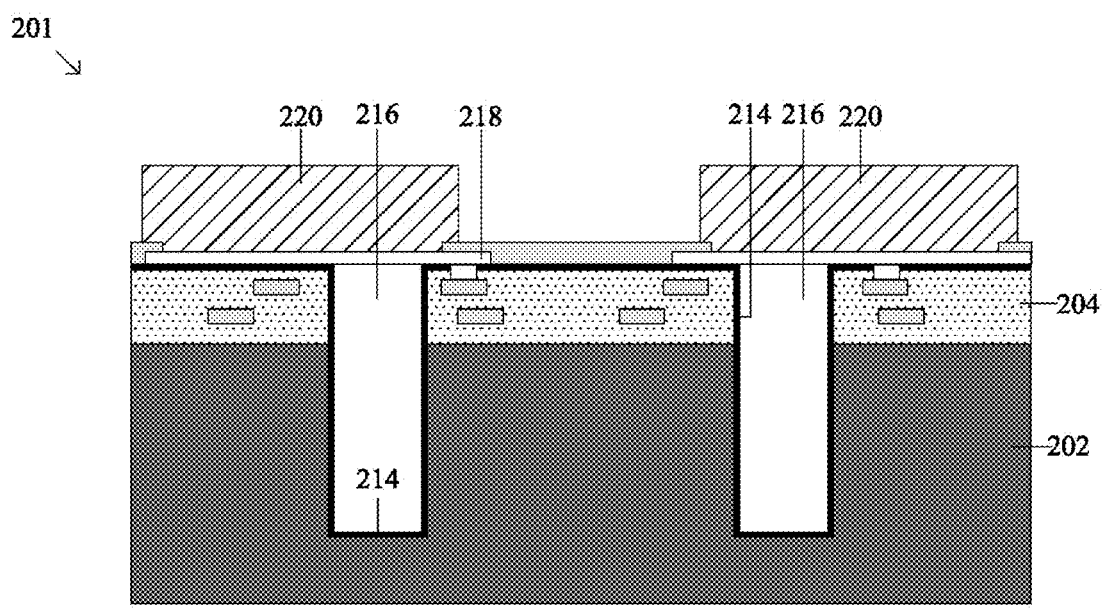
Figure 2E:
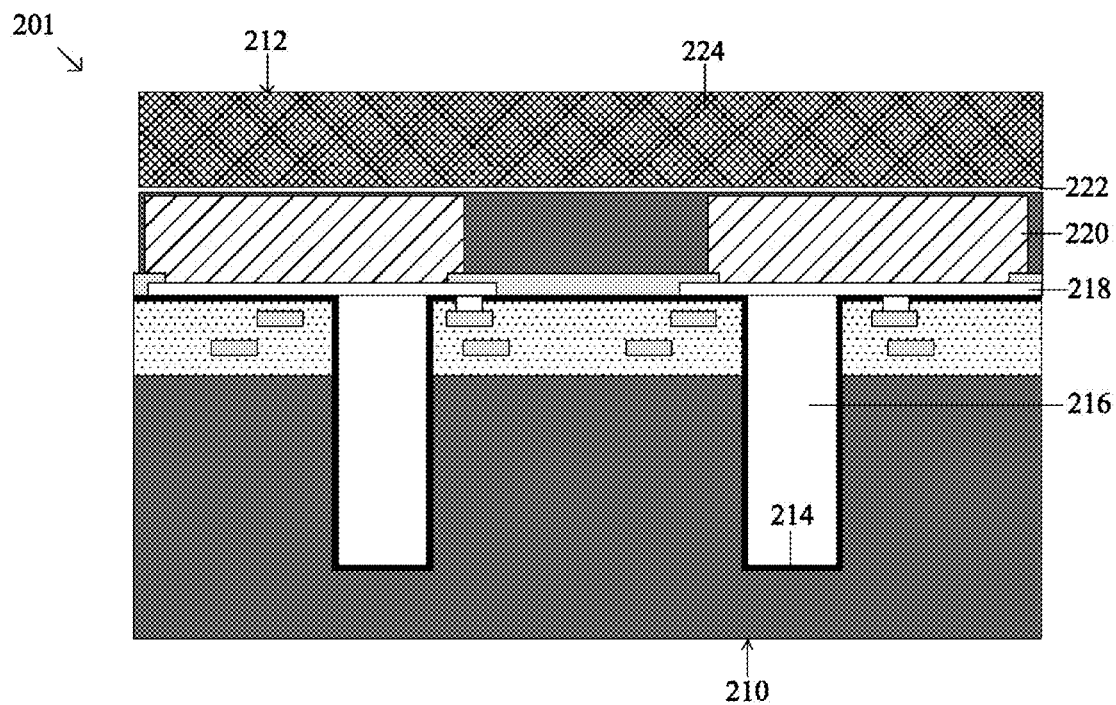
Figure 2F:
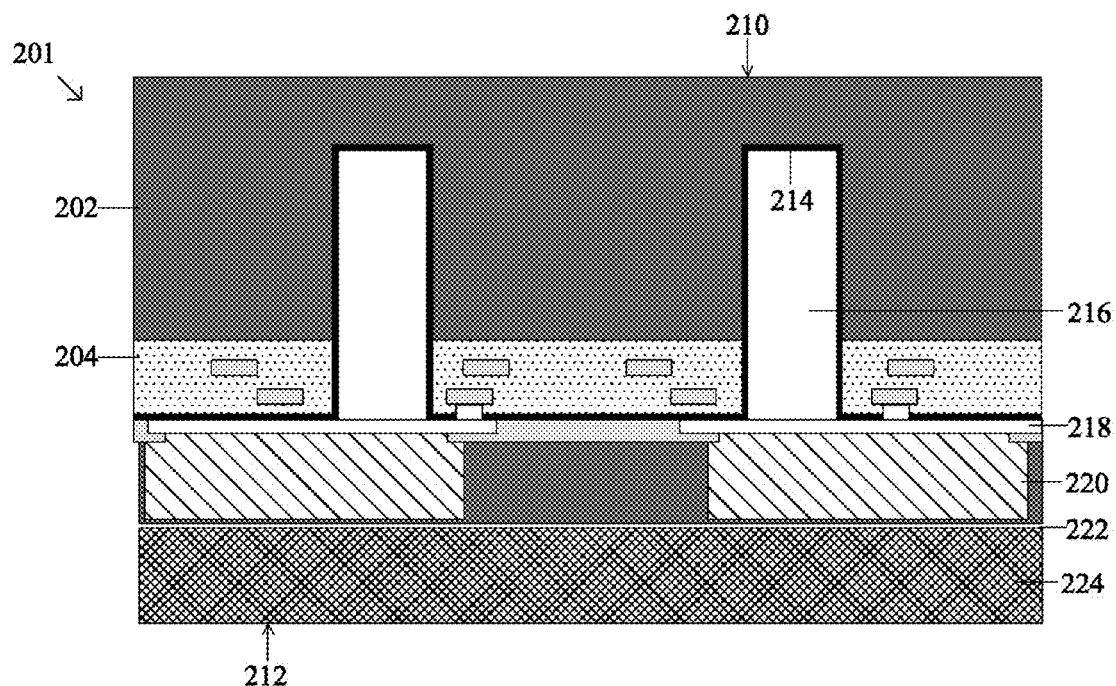

Turning to FIG. 2D, a conductive material, or the like, may then be disposed on substrate 201 and patterned forming an under metallization bump (UMB) type structure 220. Carrier 224 is then attached to second side 212 of substrate 201 with adhesive 222 or the like, as shown in FIG. 2E.

Substrate 201 is inverted such that first side 210 may be thinned. (See FIG. 2F.) First side 210 may be thinned several microns, thus removing a portion of bulk 202. Substrate 201 may be thinned in a grinding, lapping, etching, polishing, or combination process. In one embodiment, substrate 201 may be thinned and first side 210 may be recessed in a single process step.

Figure 2G:
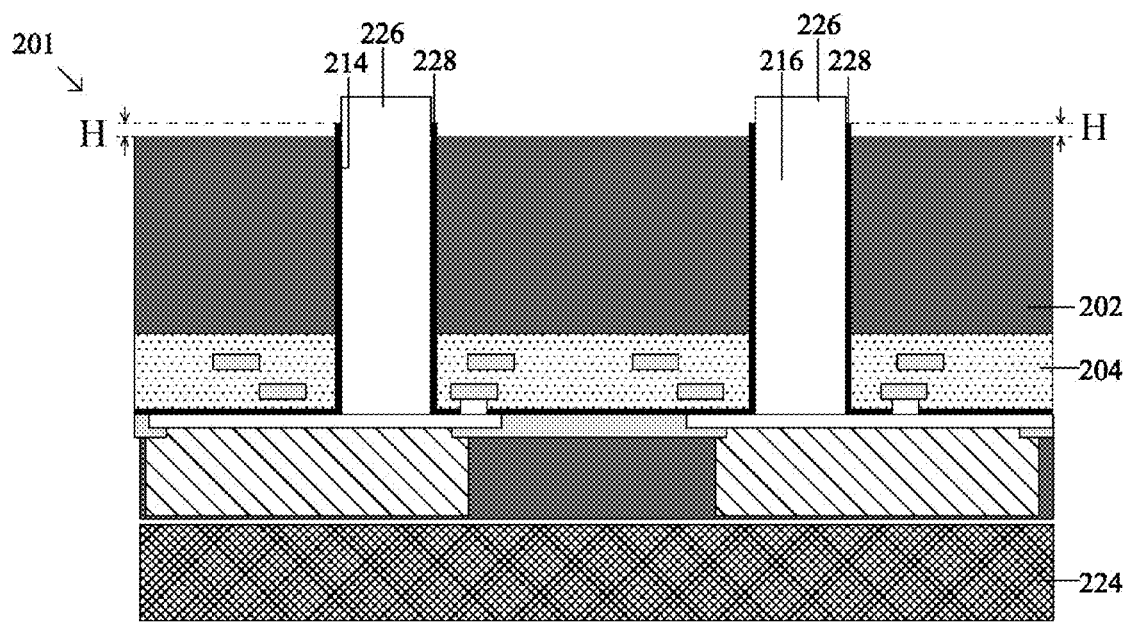

In a preferred embodiment, however, the recess process may be performed in a multi-step process by, for example, a CMP process, a wet etch process, followed by a dry etch process. Turning next to FIG. 2G, the wet etch process preferably has a high bulk 202 to isolation liner 214 selectivity. A selectivity of greater than 10:1 may be employed, however, a bulk 202 to isolation liner 214 etch selectivity of greater than 20:1 is preferred. The high selectivity of this etch causes bulk 202 of first side 210 to etch at a faster rate than isolation liner 214. Thus, isolation liner 214 on TSV structures 216 protrudes from bulk 202. Isolation liner 214 protects TSV structures 216 from etching.

The wet etch may be followed by a dry etch wherein the top of TSV structures 216 are cleared of isolation liner 214, leaving a portion of TSV structures 216 protected by isolation liner 214. The resultant structure FIG. 2G shows bulk 202 of substrate 201 with TSV structures 216 protruding from the surface. A first portion of protruding TSV 226 comprises exposed Cu or other conductive material. Further, a second portion of protruding TSV 228 remains protected, by isolation liner 214. Isolation liner 214 extends a height H from bulk 202, wherein H may be from about 5 μm to about 15 μm. A protected TSV sidewall is an advantage of an embodiment, in that the Cu or other material of TSV structures 216 is protected from oxidation by the un-etched isolation liner 214, thus eliminating a cause of current leakage. Moreover, a first side isolation layer deposition and subsequent patterning is rendered unnecessary, thereby reducing the cost and complexity of processing.

Figure 2H:
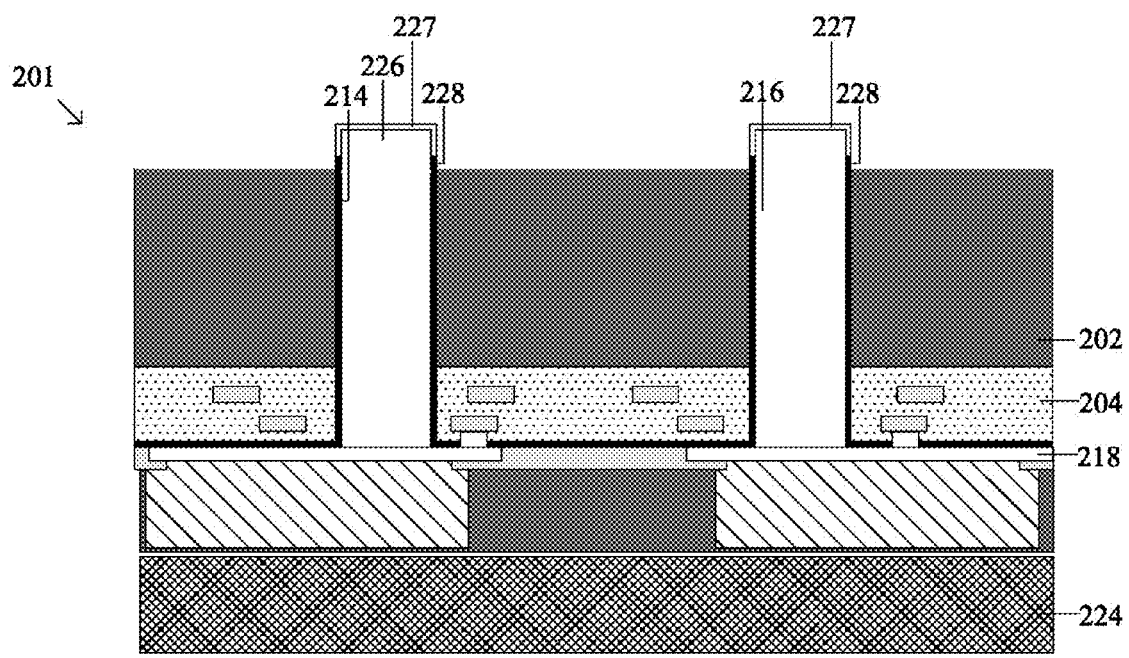

Turning to FIG. 2H, first portions of protruding TSV 226 are then electro-plated with a wetting layer, for example, electroless nickel/immersion gold (ENIG) 227 or other metal finish process. In this example, ENIG 227 consists of electroless nickel plating covered with a thin layer of immersion gold for protecting the nickel from oxidation, which provides a good wetting material for solder 232. (Not shown on FIG. 2H. See FIG. 2J.) ENIG 227 resists oxidation and is resistant to the wetting layer, thus preventing or minimizing the corrosion of the Cu. Further, this structure provides a good joint with solder 232, or other materials employed in TSV structures 216. ENIG 227 plates any exposed Cu portions of TSV structures 216. Thus, the protruding TSV structures 216 is substantially protected from oxidation by either isolation liner 214 or ENIG 227. ENIG 227 may be accomplished in a two part dip process consisting of a Ni dip and a subsequent Au dip.

Figure 2I:
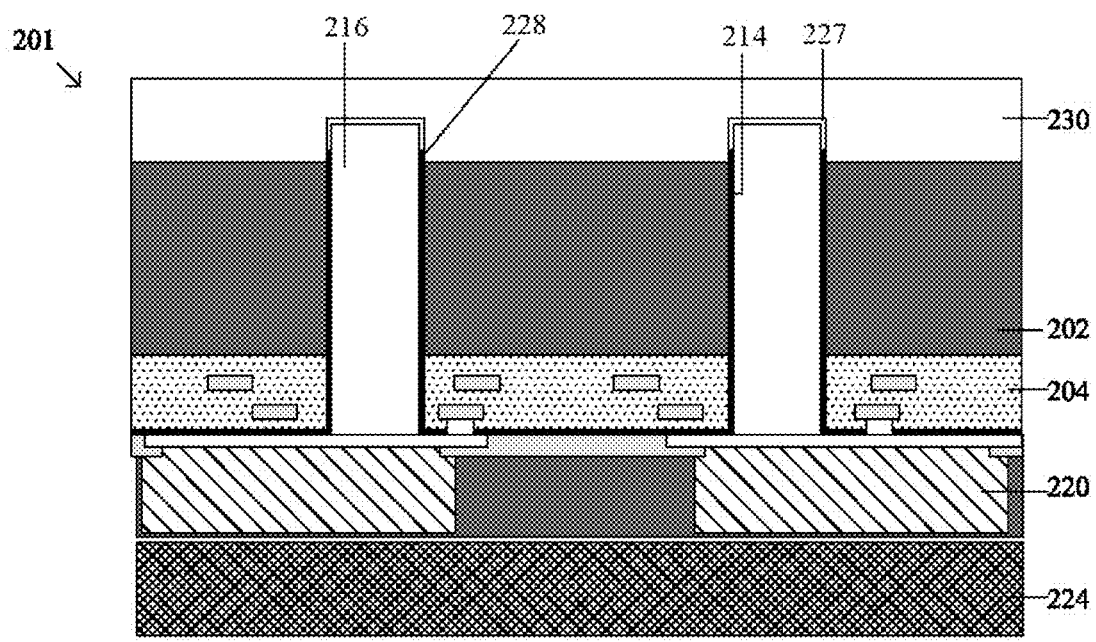

Turning to FIG. 2I, substrate 201 is coated with under-fill 230. Under-fill 230 may comprise a polymer, for example. There are several types of under-fill materials with differing properties relative to thermal transfer and mechanical properties. All under-fill materials are within the scope of these embodiments.

Figure 2J:
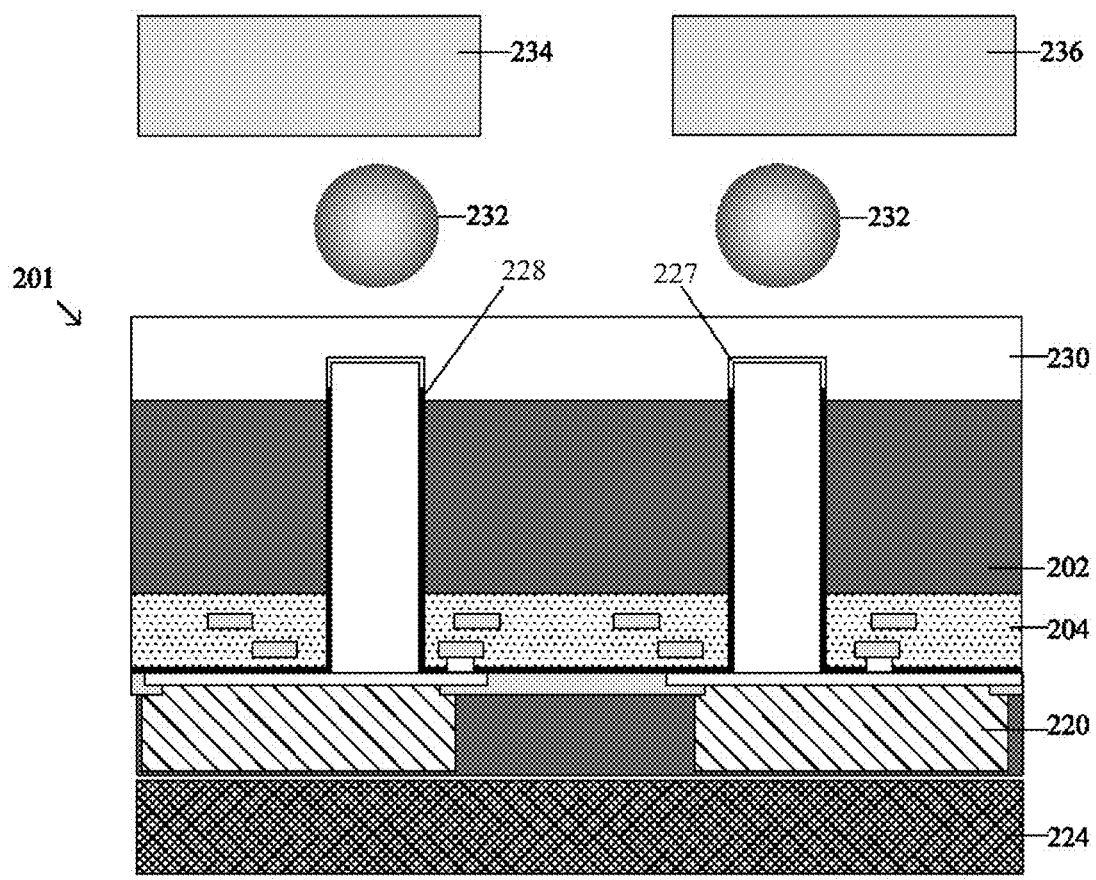

Turning next to FIG. 2J, dies 234 and 236 are bonded to the TSV structures 216 in a bonding reflow process. Solder 232 bonds dies 234 and 236 to substrate 201 by bonding a conducting pad of dies 234 and 236 to ENIG 227 of TSV structures 216 of substrate 201. The bonding process may be accomplished by thermal, thermosonic compression, or the like.

Figure 2K:
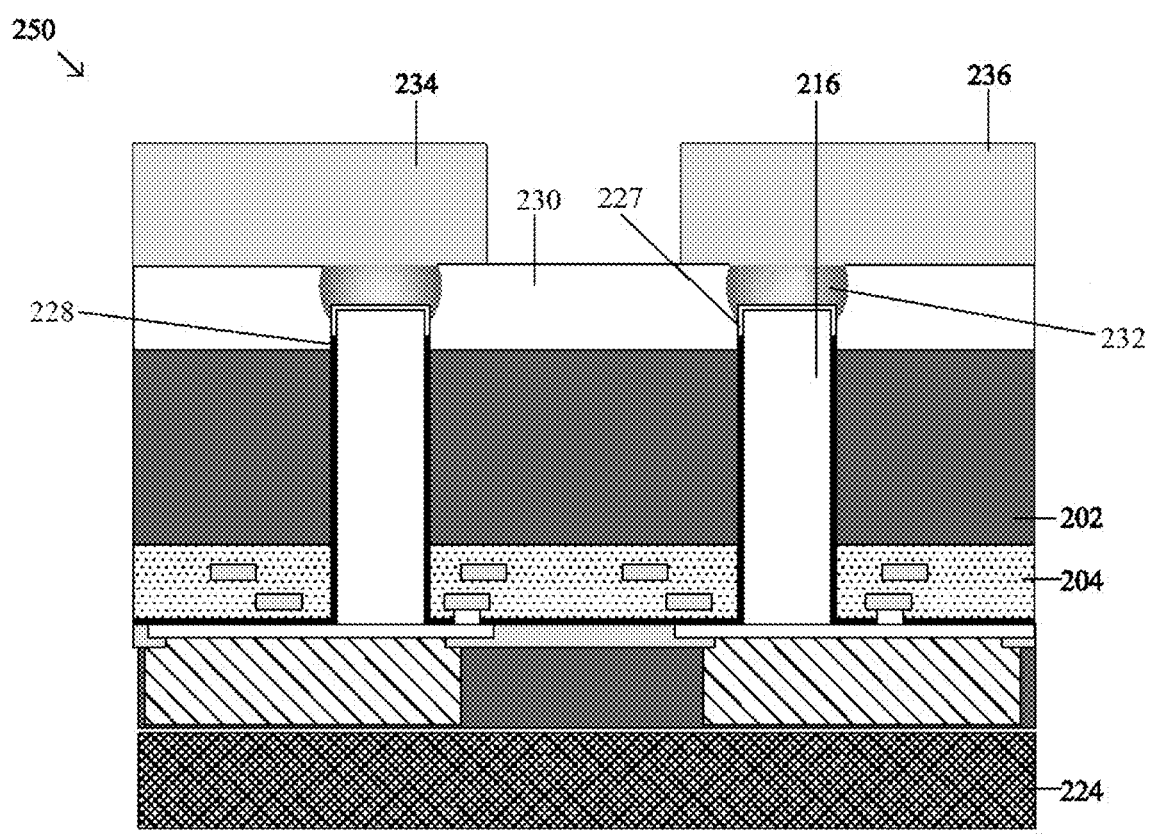

Turning to FIG. 2K the resulting structure 250 is depicted. Under-fill 230 can be seen adding structural support. The substrate may be processed further with processes known by those of ordinary skill in the art or the process may then end.

Figure 3:
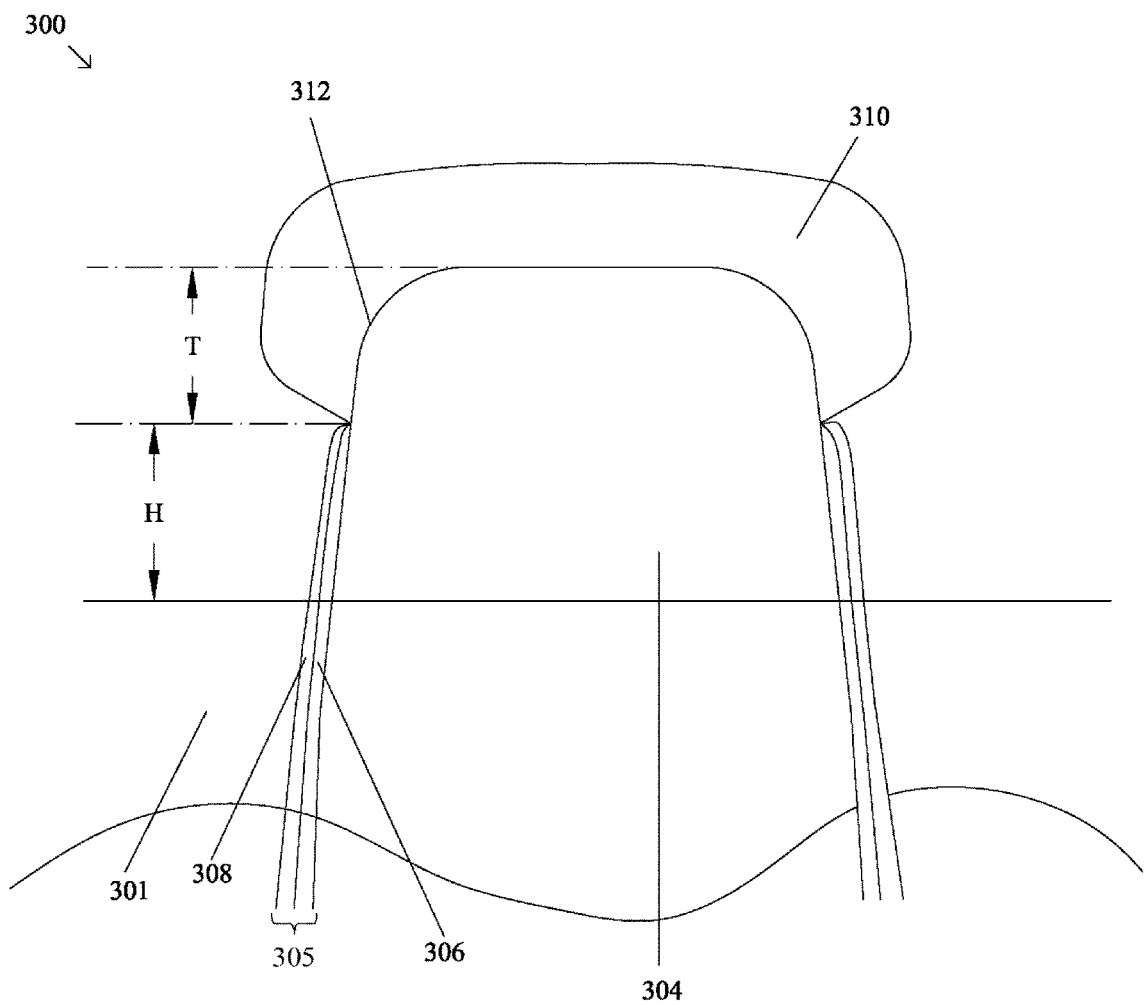
FIG. 3 depicts details of a stacking-joint interface structure.

FIG. 3 is a detailed depiction of a partial stacking-joint interface. Substrate 300 comprises bulk 301. TSV 304 is shown protruding from bulk 301. Isolation liner 305 may comprise multiple layers, such as first layer 308 or layers of tetraethyl orthosilicate (TEOS), thermally grown silicon dioxide, other dielectrics, or the like. First layer 308 may be a thickness of between about 20 k Å and about 30 k Å. Second layer 306 may be silicon nitride, or the like. Second layer 306 may be a thickness of between about 5 k Å and about 15 k Å.

Isolation liner 305 protrudes from substrate 301 a height H, wherein height H may be between about 4 μm and about 15 μm. Note that TSV 304 has a convex shape. The convex shape of TSV 304 may aid in providing a good electrical and structural bond. TSV 304 also has remaining protruding portion 312 that is not protected by isolation liner 305. Remaining protruding portion 312 has a height T, wherein T may be between about 4 μm and about 15 μm. ENIG layer 310 is disposed on remaining protruding portion 312. ENIG layer 310 comprises an electroless Ni layer of between about 1 μm to about 4 μm thick, which is immersed in Au. ENIG layer 310 is an effective anti-diffusion/wetting layer. A substrate, die or wafer which includes an embodiment, such as shown in FIG. 3, may be stored for further processing or transported for further processing, since the conductive TSV material (in this embodiment Cu) is protected from corrosion and oxidation.

Therefore, a system of stacked substrates, which may include dies, partial wafers, and wafers, is presented. Further, a partial stacked-joint interface is depicted, showing an illustrative embodiment in which die, partial wafers, or wafers may be stored or transported before bonding. Yet further, a method of manufacturing an embodiment of stacked substrates has been presented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A partial joint structure comprising:
    a substrate with a first side and a second side;
    a through substrate via (TSV) comprising a conductive fill material disposed in an opening in the substrate, the TSV protruding from the first side;
    a first protruding portion of the TSV including a top surface and an upper portion of the vertical sides of the TSV protruding from the first side having a conductive protective coating physically contacting the conductive fill material of the TSV; and
    a second protruding portion of the TSV including a lower portion of the vertical sides of the TSV protruding from the first side having an isolation liner coating and physically contacting the conductive fill material and free from the conductive protective coating, wherein the second protruding portion protrudes between about 4 μm and about 15 μm above the first side.

2. The partial joint structure of claim 1, wherein the conductive protective coating is an electroless nickel/immersion gold (ENIG).

3. The partial joint structure of claim 2, wherein the ENIG is between about 1 μm and about 4 μm thick.

4. The partial joint structure of claim 1, wherein the isolation liner comprises an oxide, a nitride, or a low-k dielectric.

5. The partial joint structure of claim 1, wherein a first protruding portion of the TSV protrudes between about 4 μm and about 15 μm above the second protruding portion of the TSV.

6. The partial joint structure of claim 1, wherein the first protruding portion of the TSV has a convex shape.

7. The partial joint structure of claim 1, wherein the partial joint structure is stored or in transport for greater than 10 hours before bonding.

8. A structure of stacked integrated circuits, the structure comprising:
    a partial joint structure comprising:

a first substrate with a first side and a second side;

a through substrate via (TSV) comprising a conductive fill material disposed in an opening in the substrate and protruding from the first side;

a first protruding portion of the TSV including a top surface and an upper portion of vertical sides of the TSV protruding from the first side having a conductive protective coating physically contacting the conductive fill material of the TSV; and a second protruding portion of the TSV including a lower portion of the vertical sides of the TSV protruding from the first side having an isolation liner coating overlying the conductive fill material and free from the conductive protective coating;

a second substrate bonded to the first protruding portion of the TSV of the first substrate employing solder.

9. The structure of claim 8, wherein the conductive protective coating is an electroless nickel/immersion gold (ENIG).

10. The structure of claim 8, wherein the second protruding portion of the TSV protrudes between about 4 μm and about 15 μm above the first side.

11. The structure of claim 8, wherein the partial joint structure is stored or transported for greater than 10 hours before bonding to the second substrate.

12. A partial joint structure comprising:
a first semiconductor substrate having formed therein a circuit and having a first major surface;

a through substrate via (TSV) comprising a conductive fill material extending through the substrate and extending beyond the first major surface;

a conductive material surrounding and physically contacting a first portion of the TSV including a top surface and an upper portion of vertical sides of the first portion of the TSV that extends a first length beyond the first major surface;

an insulating material surrounding and physically contacting a second portion of the TSV different from the first portion including another lower portion of the vertical sides of the TSV and free of the conductive material that extends a second length beyond the first major surface; and a liner material surrounding a third portion of the TSV that does not extend beyond the first major surface.

13. The partial joint structure of claim 12 further comprising:
a second substrate solder bonded to the TSV by way of the conductive material.

14. The partial joint structure of claim 13 wherein the conductive material is electroless nickel/immersion gold (ENIG).

15. The partial joint structure of claim 12 wherein the first portion is between 4 μm or greater and 15 μm or less.

16. The partial joint structure of claim 15 wherein the second portion is between 4 μm or greater and 15 μm or less.

17. The partial joint structure of claim 12 wherein the TSV is formed of a conductive fill material selected from the group consisting essentially of aluminum, copper, and copper alloys.

18. The partial joint structure of claim 12 wherein the liner material is formed of a material selected from the group consisting essentially of an oxide, a nitride, a low-k dielectric, and combinations thereof.

19. The partial joint structure of claim 12 further comprising an underfill material coating the first major surface of the first semiconductor substrate.

20. The partial joint structure of claim 12 wherein the TSV has a convex shape where it extends beyond the first major substrate.

\* \* \* \* \*